(12) United States Patent
Tsai (10) Patent No.: US 11,217,589 B2
(45) Date of Patent: Jan. 4, 2022

(54) SEMICONDUCTOR DEVICE AND METHOD OF MANUFACTURING THE SAME

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 189 days.

(21) Appl. No.: 16/592,784

(22) Filed: Oct. 4, 2019

(65) Prior Publication Data
US 2021/0104525 A1 Apr. 8, 2021

(51) Int. Cl.
| | |
|---|---|
| *H01L 23/528* | (2006.01) |
| *H01L 27/108* | (2006.01) |
| *H01L 29/423* | (2006.01) |
| *H01L 29/66* | (2006.01) |
| *H01L 29/10* | (2006.01) |
| *H01L 29/786* | (2006.01) |
| *H01L 21/768* | (2006.01) |
| *H01L 21/3213* | (2006.01) |
| *H01L 21/311* | (2006.01) |
| *H01L 21/764* | (2006.01) |

(52) U.S. Cl.
CPC .... *H01L 27/1082* (2013.01); *H01L 21/31111* (2013.01); *H01L 21/32133* (2013.01); *H01L 21/764* (2013.01); *H01L 21/76802* (2013.01); *H01L 21/76877* (2013.01); *H01L 23/528* (2013.01); *H01L 27/10873* (2013.01); *H01L 27/10885* (2013.01); *H01L 27/10891* (2013.01); *H01L 29/1037* (2013.01); *H01L 29/42392* (2013.01); *H01L 29/66742* (2013.01); *H01L 29/66969* (2013.01); *H01L 29/7869* (2013.01); *H01L 29/78642* (2013.01)

(58) Field of Classification Search
CPC ............... H01L 23/528; H01L 27/1082; H01L 27/10873; H01L 27/10885; H01L 27/10891; H01L 29/1037; H01L 29/42392; H01L 29/66742; H01L 29/66969; H01L 29/78642; H01L 29/7869
USPC ....................................................... 257/296
See application file for complete search history.

(56) References Cited

U.S. PATENT DOCUMENTS

| 8,822,335 B2 | 9/2014 | Lee et al. |
| 9,698,272 B1 | 7/2017 | Ikeda et al. |

(Continued)

FOREIGN PATENT DOCUMENTS

TW 201824515 A 7/2018

*Primary Examiner* — Long K Tran
(74) *Attorney, Agent, or Firm* — CKC & Partners Co., LLC (57) ABSTRACT

A semiconductor device includes a first vertical transistor, a second vertical transistor adjacent to the first vertical transistor, and an air gap inserted between the first vertical transistor and the second vertical transistor. The first vertical transistor includes a first channel region, a first word line wrapping the first channel region, and a first word line dielectric layer between the first channel region and the first word line. The second vertical transistor includes a second channel region, a second word line wrapping the second channel region, and a second word line dielectric layer between the second channel region and the second word line. The first word line and the second word line respectively have a top width and a bottom width, and the top width is greater than the bottom width.

7 Claims, 11 Drawing Sheets

(56) References Cited

U.S. PATENT DOCUMENTS

2015/0126013 A1* 5/2015 Hwang .............. H01L 23/5226
                                                    438/381
2019/0319044 A1* 10/2019 Harari .............. H01L 27/11573

* cited by examiner

SEMICONDUCTOR DEVICE AND METHOD OF MANUFACTURING THE SAME

BACKGROUND

Field of Invention

The present invention relates to a semiconductor device and method of manufacturing the same.

Description of Related Art

A Dynamic Random Access Memory (DRAM) device is a type of random access memory that stores each bit of data in a separate capacitor within an integrated circuit. Typically, DRAM is arranged in a square array of one capacitor and transistor per cell. A vertical transistor has been developed for the 4F 2 DRAM cell, where F stands for the photolithographic minimum feature width or critical dimension (CD). However, recently DRAM manufacturers face a tremendous challenge on shrinking the memory cell area as the word line spacing continues to shrink. For example, a parasitic capacitance between the word lines may be a problem as the spacing between two closely arranged word lines continues to shrink. Accordingly, there is a demand for a novel structure for reducing the parasitic capacitance and word line resistance.

SUMMARY

In accordance with an aspect of the present invention, a semiconductor device is provided. The semiconductor device includes a first vertical transistor, a second vertical transistor adjacent to the first vertical transistor, and an air gap inserted between the first vertical transistor and the second vertical transistor. The first vertical transistor includes a first channel region, a first word line wrapping the first channel region, and a first word line dielectric layer between the first channel region and the first word line. The first word line has a first top width and a first bottom width, and the first top width is greater than the first bottom width. The second vertical transistor includes a second channel region, a second word line wrapping the second channel region, and a second word line dielectric layer between the second channel region and the second word line. The second word line has a second top width and a second bottom width, and the second top width is greater than the second bottom width.

According to some embodiments of the present invention, the semiconductor device further includes a bit line over the first vertical transistor and the second vertical transistor.

According to some embodiments of the present invention, the semiconductor device further includes a first capacitor under the first vertical transistor and a second capacitor under the second vertical transistor.

According to some embodiments of the present invention, the air gap further extends to be inserted between the first capacitor and the second capacitor.

According to some embodiments of the present invention, the semiconductor device further includes an interlayer dielectric layer between the first vertical transistor and the second vertical transistor.

According to some embodiments of the present invention, the first channel region and the second channel region include silicon or oxide semiconductor.

According to some embodiments of the present invention, the first top width and the second top width is respectively at least 1 nm greater than the first bottom width and the second bottom width.

In accordance with another aspect of the present invention, a method of manufacturing a semiconductor device is provided. The method includes following operations: providing a precursor structure including a first capacitor and a second capacitor on a substrate; forming a first vertical transistor and a second vertical transistor respectively over the first capacitor and the second capacitor, wherein the first vertical transistor includes a first word line having a first top width and a first bottom width smaller than the first top width, the second vertical transistor includes a second word line having a second top width and a second bottom width smaller than the second top width; and forming an air gap between the first vertical transistor and the second vertical transistor.

According to some embodiments of the present invention, forming the first vertical transistor and the second vertical transistor includes: forming a first opening and a second opening respectively on the first capacitor and the second capacitor; forming a word line material in the first opening and the second opening; etching the word line material to form the first word line, the second word line, a first through hole encircled by the first word line, and a second through hole encircled by the second word line; forming a first word line dielectric layer and a second word line dielectric layer respectively in the first through hole and the second through hole; and forming a first channel region and a second channel region respectively encircled by the first word line dielectric layer and the second word line dielectric layer.

According to some embodiments of the present invention, the first opening and the second opening respectively has an inclined side surface.

According to some embodiments of the present invention, the first channel region and a second channel region include silicon or oxide semiconductor.

According to some embodiments of the present invention, forming the air gap between the first vertical transistor and the second vertical transistor includes: etching a portion of an interlayer dielectric layer between the first word line and the second word line to form a trench; and forming a dielectric layer on a top portion of the trench to form the air gap.

According to some embodiments of the present invention, the air gap further extends to be inserted between the first capacitor and the second capacitor.

According to some embodiments of the present invention, the method further includes forming a bit line over the first vertical transistor and the second vertical transistor.

According to some embodiments of the present invention, the first word line and the second word line extend along a first direction and the bit line extends along a second direction perpendicular to the first direction.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Although below using a series of actions or steps described in this method disclosed, but the order of these actions or steps shown should not be construed to limit the present invention. For example, certain actions or steps may be performed in different orders and/or concurrently with other steps. Moreover, not all steps must be performed in order to achieve the depicted embodiment of the present invention. Furthermore, each operation or procedure described herein may contain several sub-steps or actions.

Figure 1:
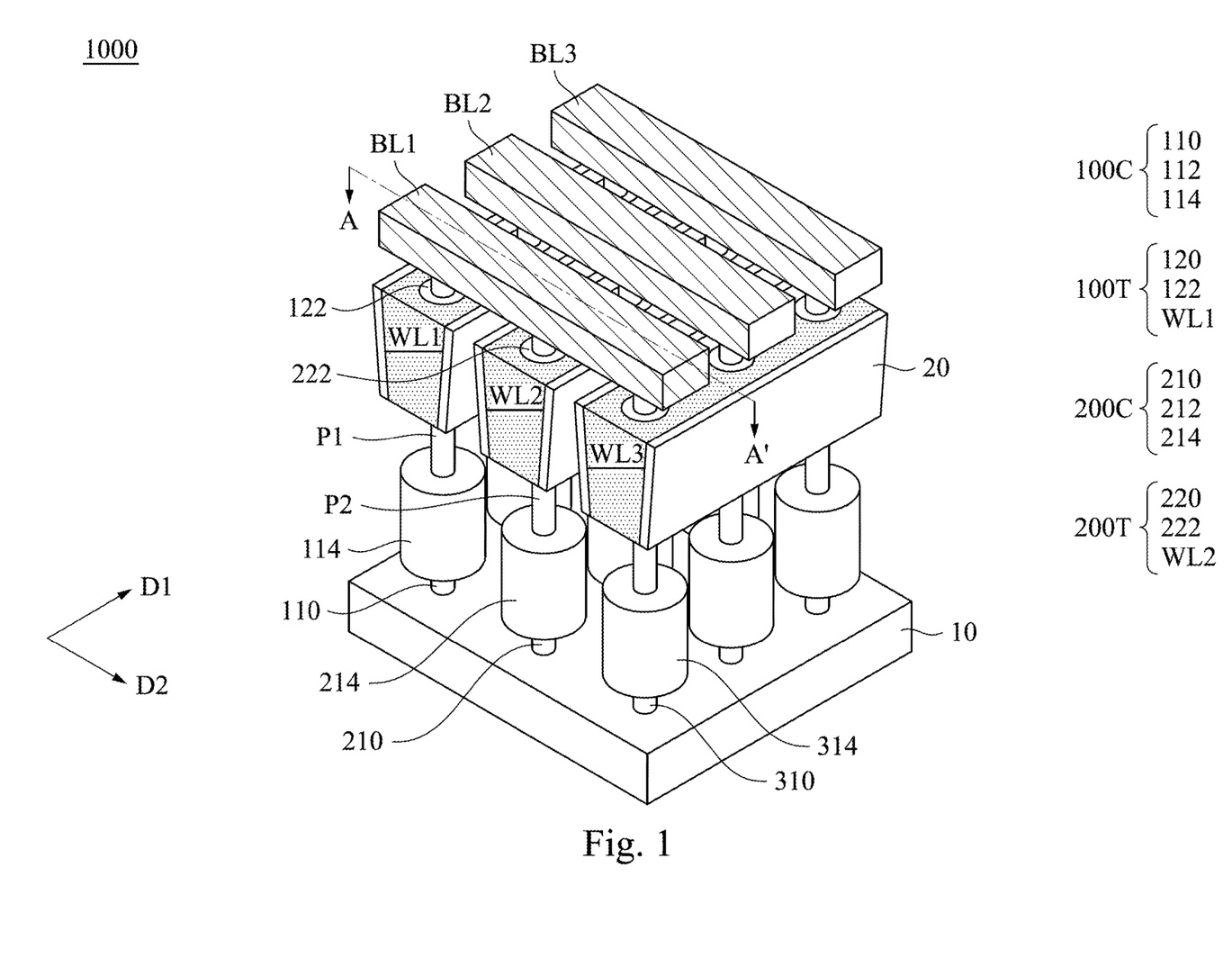
FIG. 1 is a perspective view illustrating a semiconductor device in accordance with some embodiments of the present disclosure.
Figure 2:
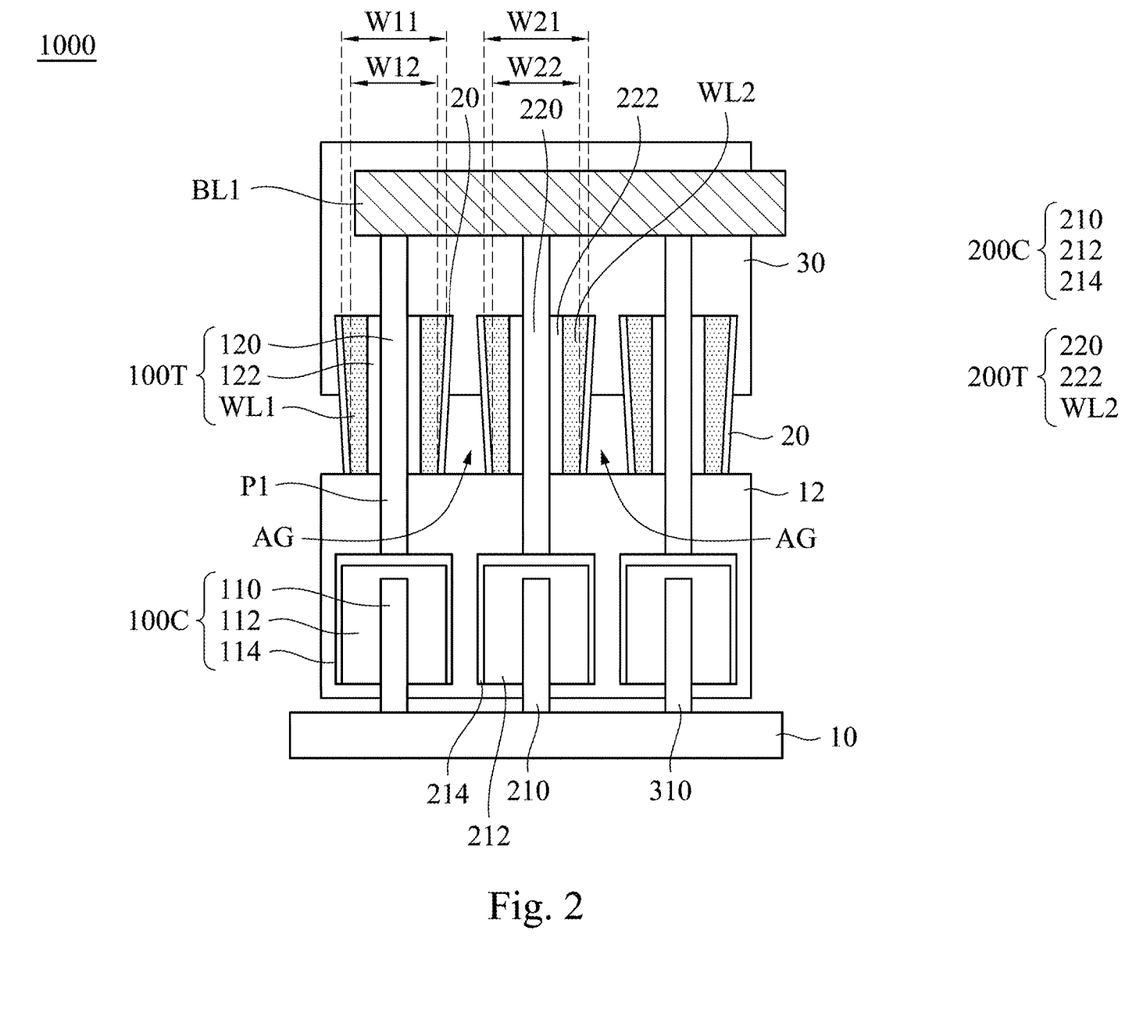
FIG. 2 is a cross-sectional view of the semiconductor device along a cut line A-A' shown in FIG. 1 in accordance with some embodiments of the present disclosure.

FIG. 1 is a perspective view illustrating a semiconductor device 1000 in accordance with some embodiments of the present disclosure. FIG. 2 is a cross-sectional view of the semiconductor device 1000 along a cut line A-A' shown in FIG. 1 in accordance with some embodiments of the present disclosure. It is noted that some elements of the semiconductor device 1000 are not shown in FIG. 1 for simplifying the drawing.

Referring to FIG. 1 and FIG. 2, the semiconductor device 1000 includes a first vertical transistor 100T, a second vertical transistor 200T, and an air gap AG. The semiconductor device 1000 may optionally include other elements, which are described hereinafter.

The first vertical transistor 100T includes a first channel region 120, a first word line dielectric layer 122, and a first word line WL1. In some embodiments, the first channel region 120 includes silicon or oxide semiconductor. Specifically, a pillar P1 may be a silicon pillar or an oxide semiconductor pillar, and a portion of the pillar P1 functions as a channel of the first vertical transistor 100T (i.e., the first channel region 120).

The first word line WL1 extends along a first direction D1 and wraps the first channel region 120. As shown in FIG. 2, the first word line WL1 has a first top width W11 and a first bottom width W12, and the first top width W11 is greater than the first bottom width W12. That is, the first word line WL1 has an inclined sidewall. In some embodiments, the first top width W11 is at least 1 nm greater than the first bottom width W12. In some embodiments, the first word line WL1 includes tungsten (W), copper (Cu), or molybdenum (Mo), but is not limited thereto.

The first word line dielectric layer 122 is disposed between the first channel region 120 and the first word line WL1. Specifically, the first channel region 120 is encircled by the first word line dielectric layer 122. In some embodiments, the first word line dielectric layer may include dielectric material such as silicon oxide.

The second vertical transistor 200T is adjacent to the first vertical transistor 100T. The second vertical transistor 200T includes a second channel region 220, a second word line dielectric layer 222, and a second word line WL2. The second vertical transistor 200T may be substantially same as the first vertical transistor 100T. That is, the material of the second channel region 220, the second word line dielectric layer 222, and the second word line WL2 may be substantially same as the corresponding components of the first vertical transistor 100T, and will not be repeated hereinafter.

As shown in FIG. 1, the second word line WL2 extends along the first direction D1 and wraps the second channel region 220. As shown in FIG. 2, the second word line WL2 has a second top width W21 and a second bottom width W22, and the second top width W21 is greater than the second bottom width W22. That is, the second word line WL2 has an inclined sidewall. In some embodiments, the second top width W21 is at least 1 nm greater than the second bottom width W22. Each of the word lines (e.g., the first word line WL1 and the second word line WL2) of the semiconductor device 1000 has a wider top side, such that a distance between the top sides of the word lines is decreased.

As shown in FIG. 2, the air gap AG is inserted between the first vertical transistor 100T and the second vertical transistor 200T. The air gap AG may extend along the first direction D1 to separate the first word line WL1 of the first vertical transistor 100T from the second word line WL2 of the second vertical transistor 200T. It is noted that the air gap AG are not necessarily filled with air, it may be filled with other types of gases, or may be vacuumed.

An interlayer dielectric layer 20 is further disposed between the first vertical transistor 100T and the second vertical transistor 200T. In some embodiments, the interlayer dielectric layer 20 is on the sidewall of the word lines (e.g., the first and the second word lines WL1 and WL2). Specifically, the interlayer dielectric layer 20 and the air gap AG collectively separate the first word line WL1 from the adjacent second word line WL2.

The first vertical transistor 100T and the second vertical transistor 200T are disposed over a substrate 10. The substrate 10 may be a semiconductor substrate and includes conductive structures such as contact plugs (not shown) disposed thereon.

The semiconductor device 1000 further includes a plurality of capacitors disposed on the substrate 10. As shown in FIG. 1 and FIG. 2, a first capacitor 100C and a second capacitor are disposed on the substrate 10. Specifically, the first capacitor 100C is disposed under the first vertical transistor 100T, and the second capacitor 200C is under the second vertical transistor 200T.

The first capacitor 100C includes a pillar as an electrode 110, an insulating layer 112, and an electrode 114. In some embodiments, the electrode 110 includes conductive material such as tungsten, copper, or the like. Although the electrode 110 shown in FIG. 1 is columnar, but the shape of electrode 110 is not limited thereto. The insulating layer 112 covers and surrounds the electrode 110. In some embodiments, the insulating layer 112 includes silicon oxide, tungsten oxide, copper oxide, aluminum oxide, hafnium oxide, or the like. The electrode 114 covers and surrounds the insulating layer 112. In some embodiments, the electrode 114 includes conductive material such as tungsten, copper, or the like. In some examples, the material of the electrode 114 may be same as the electrode 110.

The second capacitor 200C includes a pillar as an electrode 210, an insulating layer 212, and an electrode 214. The second capacitor 200C may be substantially same as the first capacitor 100C. That is, the relationship between the component and the material of the electrode 210, the insulating layer 212, and the electrode 214 may be substantially same as the corresponding components of the first capacitor 100C, and will not be repeated hereinafter.

As shown in FIG. 2, an interlayer dielectric layer 12 covers the first capacitor 100C and the second capacitor 200C. Specifically, the first vertical transistor 100T and the second vertical transistor 200T are disposed on the interlayer dielectric layer 12 and are respectively aligned with the first capacitor 100C and the second capacitor 200C. In some embodiments, the air gap AG may further extend to be inserted between the first capacitor 100C and the second capacitor 200C. Specifically, the air gap AG may further extend into the interlayer dielectric layer 12.

The semiconductor device 1000 further includes a plurality of bit lines BL1-BL3 crossing over the word lines. As shown in FIG. 1, the bit line BL1 is disposed over the first vertical transistor 100T and the second vertical transistor 200T. Specifically, the plurality of word lines WL1-WL3 extend along the first direction D1, and the plurality of bit lines BL1-BL3 extend along a second direction D2 perpendicular to the first direction D1. In some embodiments, the bit lines BL1-BL3 include includes tungsten (W), copper (Cu), or molybdenum (Mo), but is not limited thereto.

As shown in FIG. 2, the semiconductor device 1000 further includes a dielectric layer 30 covering the first word line WL1, the second word line WL2, and the bit line BL1. Specifically, the dielectric layer 30 is formed between the top side of the first word line WL1 and the top side of the second word line WL2 to seal the air gap AG. In some embodiments, the dielectric layer 30 includes a material same as the interlayer dielectric layers 12 and 20. In some examples, the dielectric layer 30 includes oxide, nitride, or low k material.

The semiconductor device 1000 may be a Dynamic Random Access Memory (DRAM) arranged in an array of one capacitor and transistor per cell. On the assumption that a pitch of each of word line and bit line is 2F, a horizontal size of memory cell can be $4F^2$. The semiconductor device 1000 can have an area of approximately $4F^2$ or less, where F is the minimum lithographic feature size.

Figure 3:
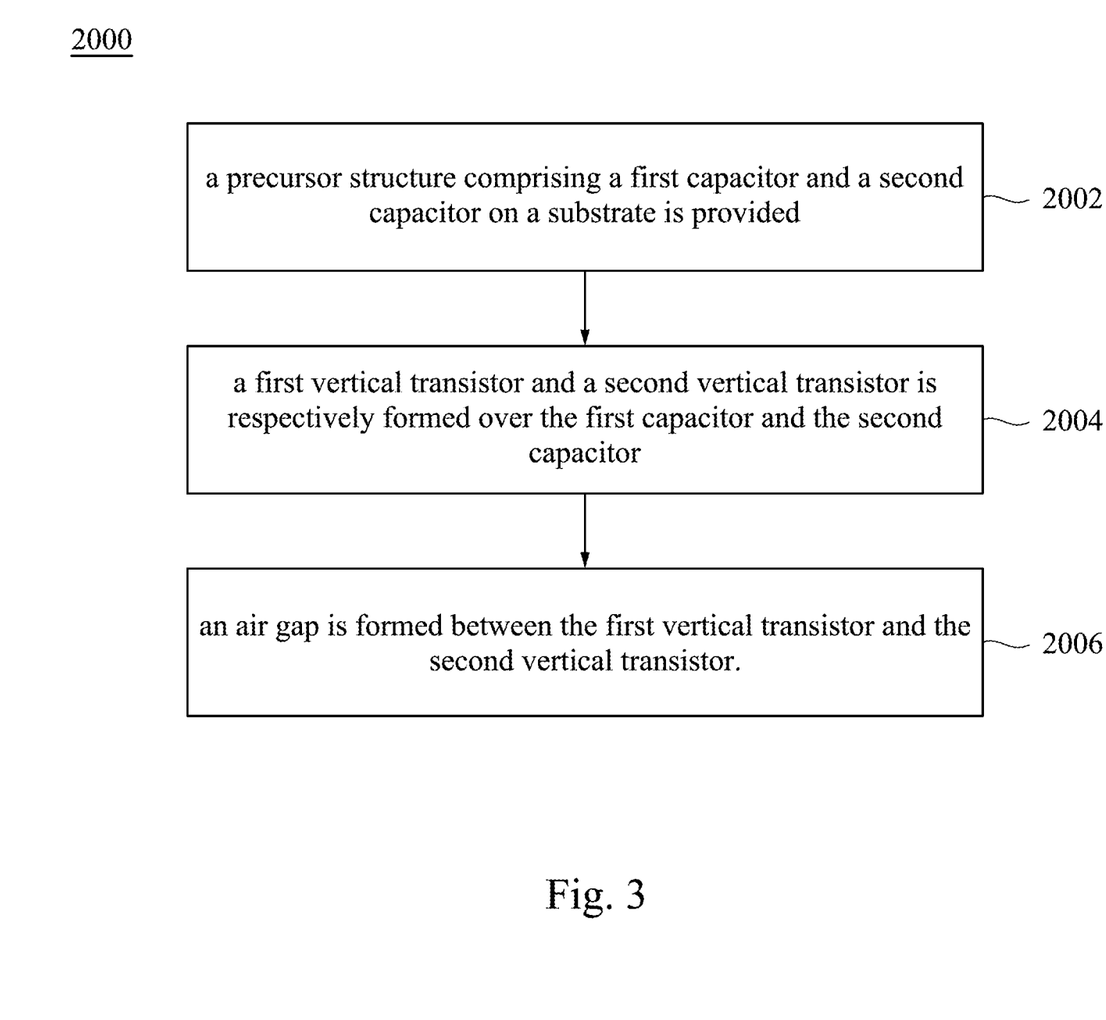
FIG. 3 is a flow chart illustrating a method of manufacturing a semiconductor device in accordance with some embodiments of the present disclosure.

Another aspect of the present disclosure is to provide a method of manufacturing a semiconductor device. It is understood that the material of the components described above will not be repeated hereinafter. FIG. 3 is a flow chart illustrating a method 2000 of manufacturing a semiconductor device in accordance with some embodiments of the present disclosure. As shown in FIG. 3, the method 2000 includes operation 2002, operation 2004, and operation 2006. FIG. 4 to FIG. 9 are cross-sectional views of various intermediary stages of method 2000 according to some embodiments of the present disclosure.

Figure 4:
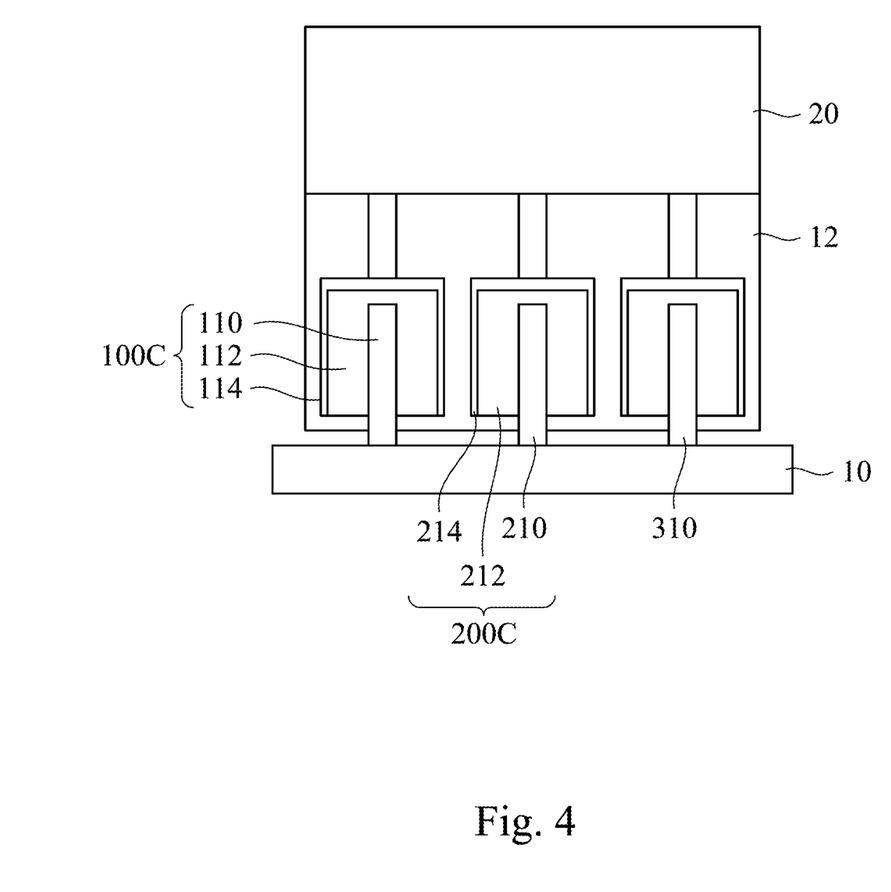
FIG. 4 to FIG. 9 are cross-sectional views of various intermediary stages in the manufacturing of semiconductor device in accordance with some embodiments of the present disclosure.

Please refer to FIG. 3 and FIG. 4, in the operation 2002 of the method 2000, a precursor structure 1001 including a first capacitor 100C and a second capacitor 200C on a substrate 10 is provided. The first capacitor 100C may include an electrode 110, an insulating layer 112, and an electrode 114, and the second capacitor 200C may include an electrode 210, an insulating layer 212, and an electrode 214. As shown in FIG. 4, the precursor structure 1001 further includes an interlayer dielectric layer 12 covering the first capacitor 100C and the second capacitor 200C, and an interlayer dielectric layer 20 over the interlayer dielectric layer 12.

Figure 5:
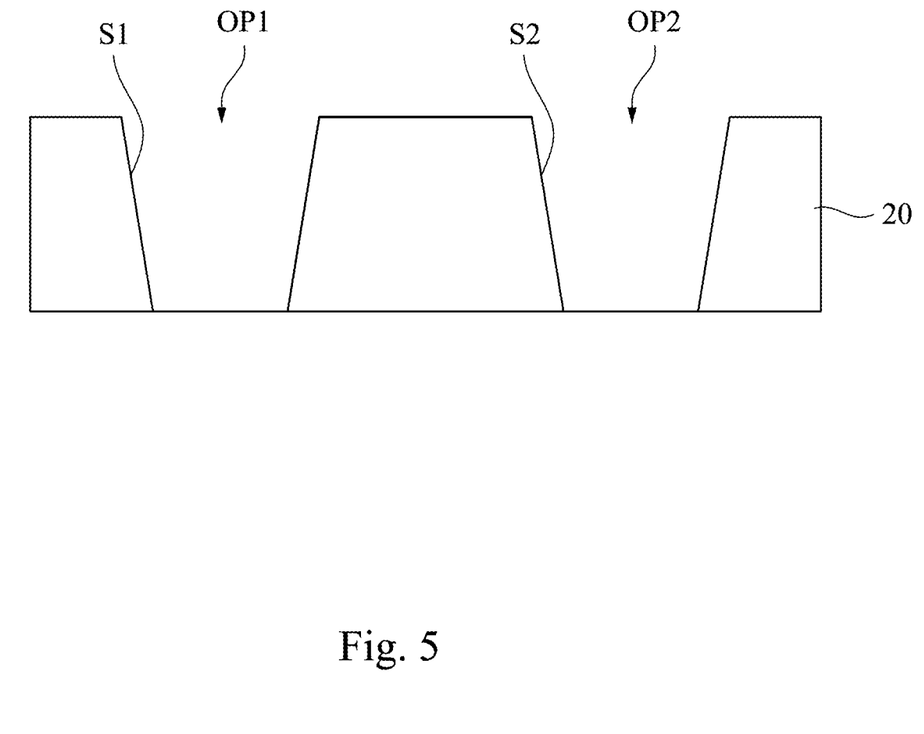
Figure 6:
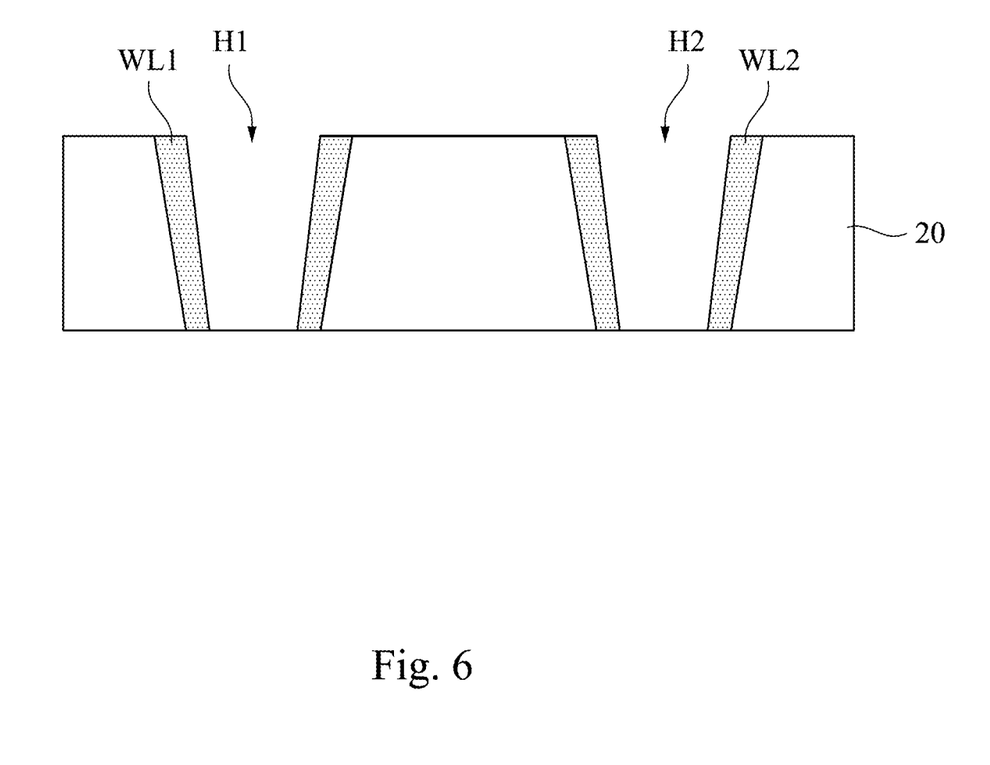
Figure 7:
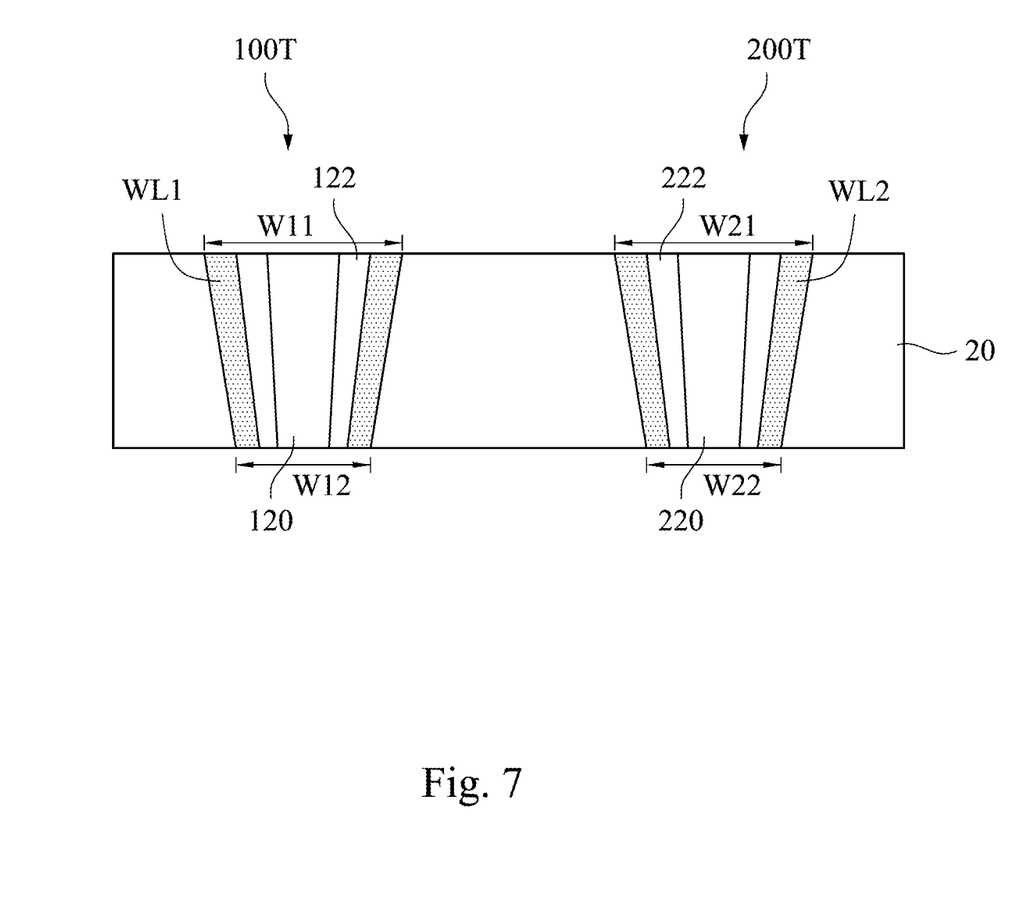

Next, please refer to FIG. 3, in the operation 2004 of the method 2000, a first vertical transistor 100T and a second vertical transistor 200T is respectively formed over the first capacitor 100C and the second capacitor 200C. FIGS. 5-7 illustrate the detail steps of implementing operation 2004 in accordance with some embodiments of the present disclosure. It is noted that FIG. 5 to FIG. 7 focus on the formation of the first vertical transistor 100T and the second vertical transistor 200T, and therefore some elements of the precursor structure 1001 are not shown in FIGS. 5-7 for simplifying the drawing.

Please refer to FIG. 5, a first opening OP1 and a second opening OP2 are formed in the interlayer dielectric layer 20. The first opening OP1 and the second opening OP2 may be formed by a wet etching method, and a shape of the first opening OP1 and the second opening OP2 can be controlled by adjusting an etching rate. Specifically, the first opening OP1 and the second opening OP2 penetrate the interlayer dielectric layer 20 and are respectively formed on the first capacitor 100C and the second capacitor 200C. In some embodiments, the first opening OP1 has an inclined side surface S1 and the second opening OP2 has an inclined side surface S2. Specifically, the first opening OP1 and the second opening OP2 respectively have a top width that is greater than a bottom width.

Please refer to FIG. 6, a word line material (not shown) is formed in the first opening OP1 and the second opening OP2, and is then etched to form the first word line WL1 and the second word line WL2. Specifically, the word line material is etched to form a first through hole H1 encircled by the first word line WL1, and a second through hole H2 encircled by the second word line WL2. More specifically, the first through hole H1 and the second through hole H2 penetrate first word line WL1 and the second word line WL2, and are formed on the first capacitor 100C and the second capacitor 200C respectively. A top width of the first through hole H1 and the second through hole H2 may be greater than its bottom width, such that the first through hole H1 and the second through hole H2 respectively have an inclined side surface. In other examples, the first through hole H1 and the second through hole H2 may have a vertical side surface.

Referring to FIG. 7, a first word line dielectric layer 122 and a second word line dielectric layer 222 are respectively formed in the first through hole H1 and the second through hole H2. Specifically, the first word line dielectric layer 122 and the second word line dielectric layer 222 are formed on the side surfaces of the first through hole H1 and the second through hole H2. The first word line dielectric layer 122 and the second word line dielectric layer 222 may be formed by a combination of a deposition method such as chemical vapor deposition (CVD), and an etching method such as reactive ion etching (RIE). Specifically, a dielectric material (not shown) may be deposited in the first through hole H1 and the second through hole H2, and then be etched to form a channel (not shown) therein.

Still referring to FIG. 7, a first channel region 120 and a second channel region 220 respectively encircled by the first word line dielectric layer 122 and the second word line dielectric layer 222 are formed. Specifically, the remaining first and second through holes H1 and H2 (i.e., the channel) are completely filled with a semiconductor material to form the first channel region 120 and the second channel region 220. A planarization process such as chemical mechanical polishing (CMP) may further be performed, such that top surfaces of the first and second channel regions 120 and 220 may be substantially level with a top surface of the interlayer dielectric layer 20, top surfaces of the first and second word lines WL1 and WL2, and top surfaces of the first and second word line dielectric layers 122 and 222. In some embodiments, the first channel region 120 and the second channel region 220 are vertical pillars respectively aligned with the electrode 110 and electrode 210 shown in FIG. 4.

After the formation of the first channel region 120 and the second channel region 220, the first vertical transistor 100T and the second vertical transistor 200T are respectively formed. As shown in FIG. 7, the first vertical transistor 100T includes the first word line WL1 having a first top width W11 and a first bottom width W12 smaller than the first top width W11, and the second vertical transistor 200T includes a second word line WL2 having a second top width W21 and a second bottom width W22 smaller than the second top width W21. In some embodiments, the first top width W11 is at least 1 nm greater than the first bottom width W12. Similarly, in some embodiments, the second top width W21 is at least 1 nm greater than the second bottom width W22.

Figure 8:
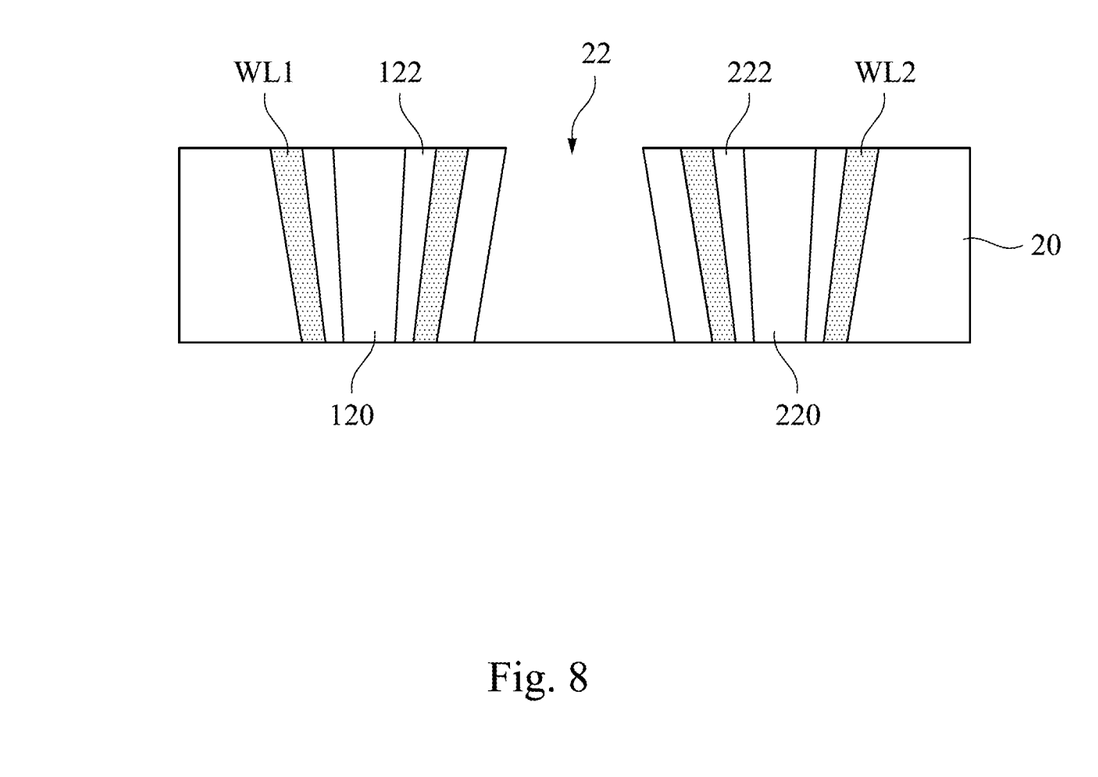
Figure 9:
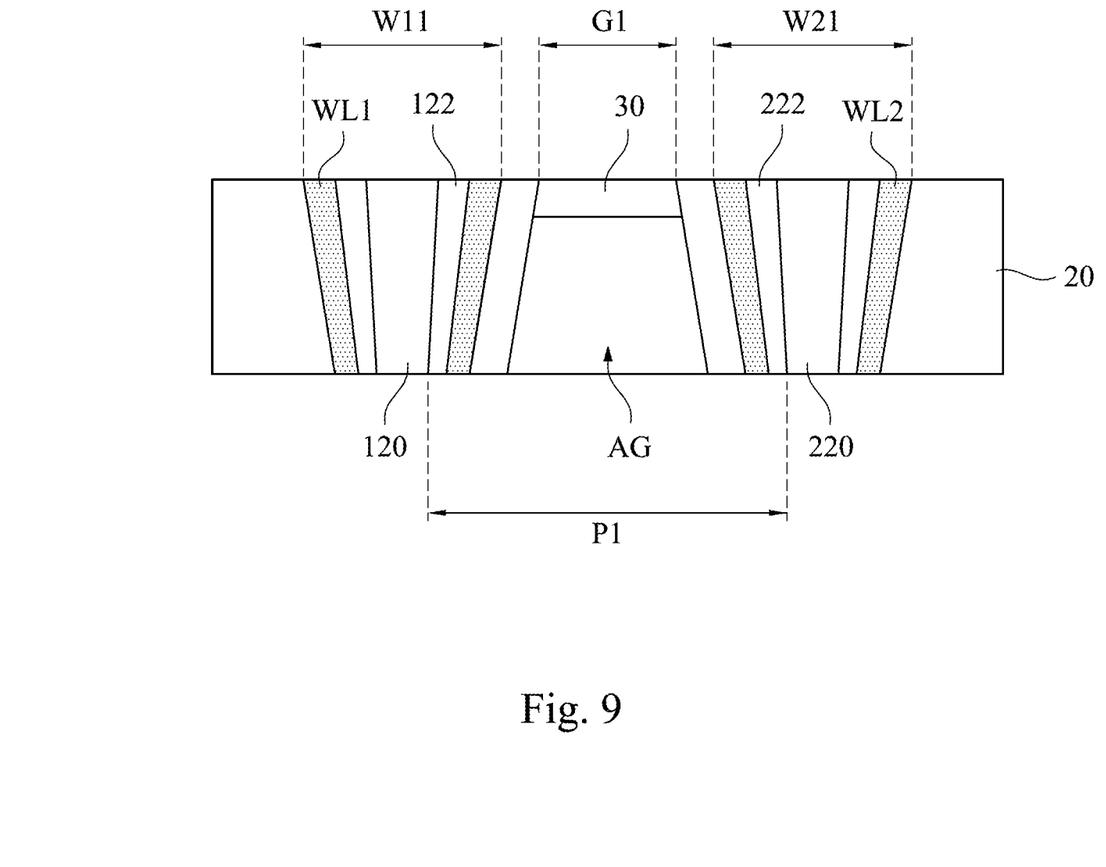

Next, please refer back to FIG. 3, in the operation 2006 of the method 2000, an air gap is formed between the first vertical transistor and the second vertical transistor. FIGS. 8-9 illustrate the detail steps of implementing operation 2006 in accordance with some embodiments of the present disclosure. It is noted that FIGS. 8-9 focus on the formation of the air gap AG, and therefore some elements (e.g., the first capacitor 100C and the second capacitor 200C) are not shown in FIGS. 8-9 for simplifying the drawing.

Please refer to FIG. 8, a portion of the interlayer dielectric layer 20 between the first word line WL1 and the second word line WL2 is etched to form a trench 22. Specifically, a portion of the interlayer dielectric layer 20 is selectively removed to form the trench 22 between the first word line WL1 and the second word line WL2. As shown in FIG. 8, a portion of the interlayer dielectric layer 20 are retained on the sidewalls of the first word line WL1 and the second word line WL2. In some embodiments, the trench 22 may have an inclined side surface as shown in FIG. 8. In other embodiments, the side surface of the trench 22 is vertical. In some embodiments, the etching process is stopped when exposing the top surface of the interlayer dielectric layer 12. In other embodiments, the etching process is further performed to etch a top portion of the interlayer dielectric layer 12 (shown in FIG. 4). Accordingly, the trench 22 may further extend to be inserted between the first capacitor 100C and the second capacitor 200C.

Please refer to FIG. 9, a dielectric layer 30 is formed on the trench 22 to form the air gap AG. Specifically, the dielectric layer 30 may be formed by suitable deposition method to seal the trench 22. In some embodiments, the air gap AG extends to be inserted between the first capacitor 100C and the second capacitor 200C to reduce a parasitic capacitance. The dielectric layer 30 may be further formed on the first vertical transistor 100T and the second vertical transistor 200T, and a bit line BL1 is further formed on the dielectric layer 30 to be positioned over the first vertical transistor 100T and the second vertical transistor 200T, as illustrated in FIG. 2. That is, forming the dielectric layer 30 is one of the steps of forming the bit line BL1 on the word lines, the air gap AG does not need an additional process to be seal. Further, the first top width W11 and the second top width W21 are enlarged, a top width G1 of the air gap AG is reduced. Accordingly, the dielectric layer 30 can easily be formed between the first word line WL1 and the second word line WL2.

Examples 1-5

Semiconductor Devices Having Air Gaps and the Top Width of the Word Line is Greater than the Bottom Width of the Word Line The structure and the manufacturing method of the semiconductor devices of Examples 1-5 can be referred to the semiconductor device 1000 and the method 2000 described above, and will not be repeated hereinafter. In Examples 1-5, the semiconductor devices include a plurality of word lines (e.g., a first word line and a second word line) respectively. Each of the word lines of the semiconductor device has a top width and a bottom width smaller than the top width. The top width and the bottom width of the word lines of Examples 1-5 are shown in Table 1 below.

TABLE 1

| Example | 1 | 2 | 3 | 4 | 5 |
|---|---|---|---|---|---|
| top width (nm) | 28 | 30 | 32 | 34 | 36 |
| bottom width (nm) | 27 | 29 | 31 | 33 | 35 |

Comparative Examples 1-5

Semiconductor Devices Without Air Gap and the Top Width of Each of the Word Lines is Consistent with its Bottom Width The structures of the semiconductor devices of the Comparative Examples 1-5 are similar to the semiconductor devices of Examples 1-5. Specifically, the Comparative Examples 1-5 have a pitch between the channel regions same as the pitch of the Examples 1-5 (i.e., the distance P1 shown in FIG. 9), respectively. However, in Comparative Examples 1-5, there is no air gap between the adjacent word lines. Further, in Comparative Examples 1-5, a top width of each of the word lines is consistent with its bottom width. That is, the width of the word line is uniform from its bottom to the top. The width of the word lines of Comparative Examples 1-5 are shown in Table 2 below.

TABLE 2

| Comparative Example | 1 | 2 | 3 | 4 | 5 |
|---|---|---|---|---|---|
| width (nm) | 27 | 29 | 31 | 33 | 35 |

Figure 10:
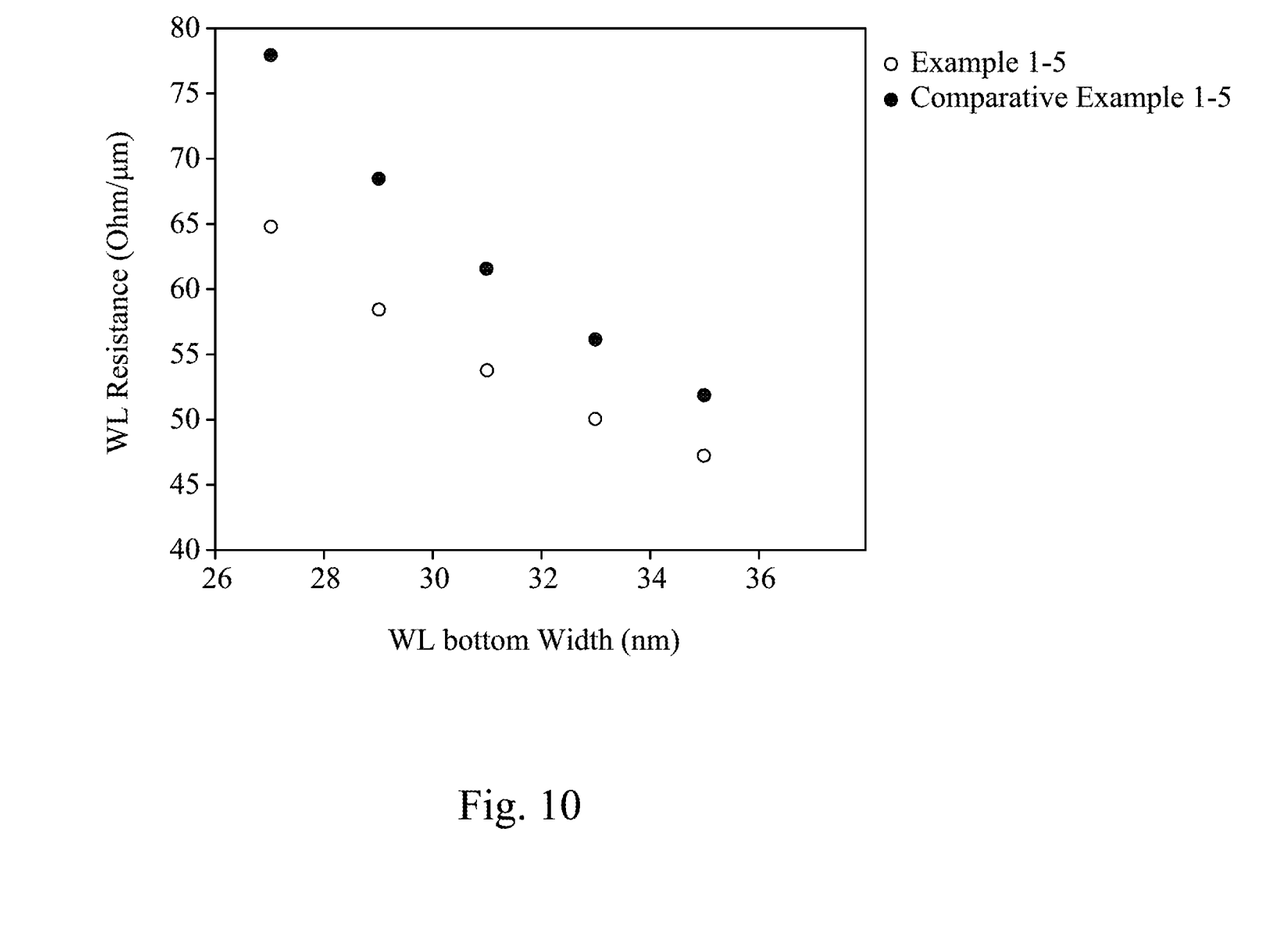
FIG. 10 is a chart illustrating the relationship between word line resistance and word line width in accordance with some embodiments of the present disclosure and comparative examples.

FIG. 10 is a chart illustrating the relationship between word line resistance and word line width in accordance with Examples 1-5 and Comparative Examples 1-5. Please refer to FIG. 10, the word line resistance is decreased when the word line width is increased. Example 1, which has a bottom width and a pitch same as the Comparative Example 1, shows lower resistance, because its cross-section area of the word line is greater than the Comparative Example 1. Similarly, Examples 2-5 have lower resistance than the Comparative Examples 2-5 respectively.

Figure 11:
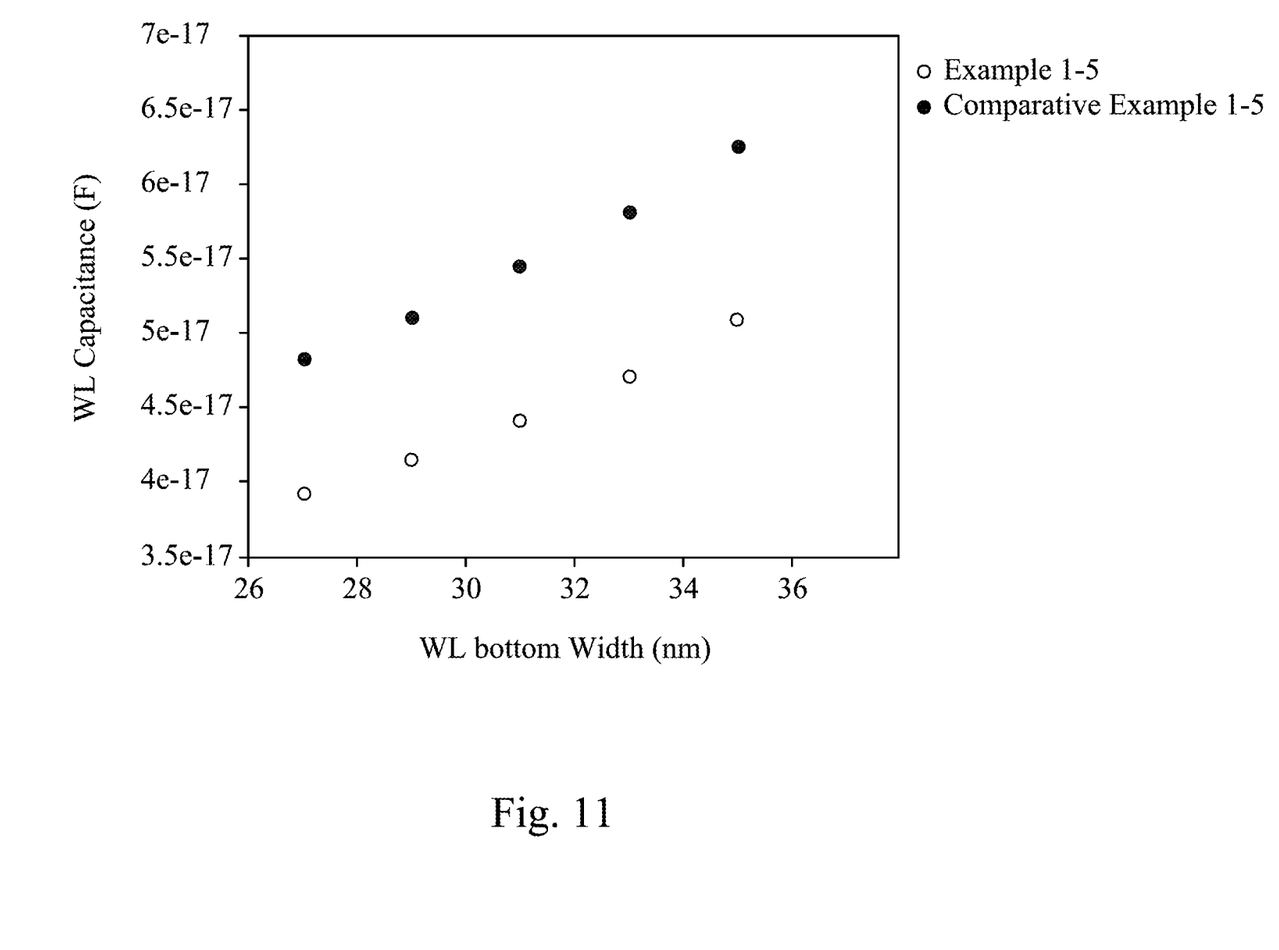
FIG. 11 is a chart illustrating the relationship between word line capacitance and word line width in accordance with some embodiments of the present disclosure and comparative examples.

FIG. 11 is a chart illustrating the relationship between word line capacitance and word line width in accordance with Examples 1-5 and Comparative Examples 1-5. Please refer to FIG. 11, the word line to word line capacitance is increased when the word line width (i.e., the parasitic capacitance) is increased. Example 1 having air gap between adjacent word lines shows lower word line to word line capacitance than Comparative Example 1, because the air gap can reduce parasitic capacitance. Similarly, Examples 2-5 have lower parasitic capacitance than the Comparative Examples 2-5 respectively.

According to the embodiments of the present disclosure, a semiconductor device and a method of manufacturing the same are provided. The semiconductor device disclosed herein includes word lines having a top width and a bottom width smaller than the top width, and an air gap between the word lines. Compared to the conventional semiconductor device having a uniform width of word line from its bottom to the top, the semiconductor device of the present disclosure has a larger cross-section area of word line, and therefore a resistance of the word line is decreased. The air gap can reduce a parasitic capacitance between the adjacent word lines. A distance between top sides of the word lines is decreased, such that the air gap can be easily formed. Specifically, the air gap can be easily enclosed by depositing a dielectric layer. Forming the dielectric layer is one of the steps to form a bit line over the word lines, such that the method of present disclosure is unnecessary to form another capping layer to seal the air gap.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
   a first vertical transistor, comprising:
      a first channel region;
      a first word line wrapping the first channel region, wherein the first word line has a first top width and a first bottom width, and the first top width is greater than the first bottom width; and
      a first word line dielectric layer between the first channel region and the first word line;
   a second vertical transistor adjacent to the first vertical transistor, comprising:
      a second channel region;
      a second word line wrapping the second channel region, wherein the second word line has a second top width and a second bottom width, and the second top width is greater than the second bottom width; and
      a second word line dielectric layer between the second channel region and the second word line; and
   an air gap inserted between the first vertical transistor and the second vertical transistor.

2. The semiconductor device of claim 1, further comprising a bit line over the first vertical transistor and the second vertical transistor.

3. The semiconductor device of claim 1, further comprising a first capacitor under the first vertical transistor and a second capacitor under the second vertical transistor.

4. The semiconductor device of claim 3, wherein the air gap further extends to be inserted between the first capacitor and the second capacitor.

5. The semiconductor device of claim 1, further comprising an interlayer dielectric layer between the first vertical transistor and the second vertical transistor.

6. The semiconductor device of claim 1, wherein the first channel region and the second channel region comprise silicon or oxide semiconductor.

7. The semiconductor device of claim 1, wherein the first top width and the second top width is respectively at least 1 nm greater than the first bottom width and the second bottom width.

* * * * *